United States Patent
Grede et al.

(10) Patent No.: US 10,042,407 B2
(45) Date of Patent: *Aug. 7, 2018

(54) POWER SUPPLY SYSTEMS AND METHODS FOR GENERATING POWER

(71) Applicant: TRUMPF Huettinger GmbH + Co. KG, Freiburg (DE)

(72) Inventors: Andre Grede, Freiburg (DE); Daniel Krausse, Mountain View, CA (US); Anton Labanc, Ehrenkirchen (DE); Christian Thome, Freiburg (DE); Alberto Pena Vidal, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 10 days.

This patent is subject to a terminal disclaimer.

(21) Appl. No.: 15/185,168

(22) Filed: Jun. 17, 2016

(65) Prior Publication Data

US 2016/0299548 A1    Oct. 13, 2016

Related U.S. Application Data (63) Continuation of application No. PCT/EP2014/077919, filed on Dec. 16, 2014.

(30) Foreign Application Priority Data

Dec. 18, 2013  (DE) ......................... 10 2013 226 511

(51) Int. Cl.
*G06F 1/32*  (2006.01)
*G06F 1/26*  (2006.01)
(Continued)

(52) U.S. Cl.
CPC .............. *G06F 1/263* (2013.01); *G06F 1/324* (2013.01); *G06F 1/3296* (2013.01);
(Continued)

(58) Field of Classification Search
CPC ........ G06F 1/3202; G06F 1/3231; G06F 1/26; G06F 1/206; G06F 1/3228; G06F 1/08;
(Continued)

(56) References Cited

U.S. PATENT DOCUMENTS 5,162,745 A * 11/1992 Koken ................... G06F 1/0321
327/105
5,712,592 A   1/1998  Stimson et al.
(Continued)

FOREIGN PATENT DOCUMENTS

CN    101056495       1/2011
DE    9210382 U1     11/1992
(Continued)

OTHER PUBLICATIONS

International Search Report for corresponding PCT Application No. PCT/EP2014/077919, dated Mar. 27, 2015, 8 pages.
(Continued)

*Primary Examiner* — Zahid Choudhury
(74) *Attorney, Agent, or Firm* — Fish & Richardson P.C.

(57) ABSTRACT

A power supply system includes a power converter configured to generate a high-frequency power signal and connected to a load to supply a plasma process or a gas laser process with power. The power converter has at least one amplifier path including at least one amplifier, an analog signal generated from a digital signal by a digital-analog converter (DAC) being supplied to the amplifier path, and a logic circuit unit configured to generate the digital signal and connected upstream of the DAC. The logic circuit unit has a signal data memory for storing signal data values for generating an analog signal form, an amplitude data memory for storing amplitude data values for influencing amplitudes of the analog signals, and a multiplier for multiplying the signal data values by the amplitude data values. The power (Continued)

converter includes an adjustable voltage supply for supplying the amplifier with a voltage.

25 Claims, 3 Drawing Sheets

(51) Int. Cl.
*H01J 37/32* (2006.01)
*H05H 1/46* (2006.01)
(52) U.S. Cl.
CPC .. *H01J 37/32174* (2013.01); *H01J 37/32944* (2013.01); *H05H 2001/4682* (2013.01)
(58) Field of Classification Search
CPC ....... G06F 1/3289; G06F 1/266; H04L 12/12; H04L 12/10
See application file for complete search history.

(56) References Cited

U.S. PATENT DOCUMENTS

| | | | |
|---|---|---|---|
| 6,703,080 | B2 | 3/2004 | Reyzelman et al. |
| 6,703,808 | B1 | 3/2004 | Blackburn et al. |
| 6,803,629 | B2 | 10/2004 | Tihanyi |
| 7,745,955 | B2 | 6/2010 | Kirchmeier et al. |
| 7,782,133 | B2 | 8/2010 | Bakalski et al. |
| 7,862,681 | B2 | 1/2011 | Choi |
| 7,872,523 | B2 | 1/2011 | Sivakumar et al. |
| 8,421,377 | B2 | 4/2013 | Kirchmeier |
| 8,462,883 | B2 | 6/2013 | Mochizuki |
| 8,482,205 | B2 | 7/2013 | Kirchmeier |
| 8,535,941 | B2 | 9/2013 | Hongo et al. |
| 8,536,941 | B2 | 9/2013 | Hongo et al. |
| 9,111,718 | B2 | 8/2015 | Merte |
| 9,276,456 | B2 * | 3/2016 | Grede ............... H02M 7/53873 |
| 2002/0057610 | A1 | 5/2002 | Baliga |
| 2005/0255809 | A1 | 11/2005 | Glueck |
| 2007/0145900 | A1 | 6/2007 | Kirchmeier et al. |
| 2007/0281635 | A1 | 12/2007 | McCallister et al. |
| 2008/0122369 | A1 | 5/2008 | Nitschke |
| 2009/0026181 | A1 | 1/2009 | Kirchmeier |
| 2009/0026968 | A1 | 1/2009 | Kirchmeier et al. |
| 2010/0171427 | A1 | 1/2010 | Kirchmeier et al. |
| 2010/0171428 | A1 | 7/2010 | Kirchmeier |
| 2010/0194476 | A1 * | 8/2010 | Drogi ................... H03F 1/0227 330/252 |
| 2012/0105166 | A1 | 5/2012 | Darges |
| 2012/0200435 | A1 | 8/2012 | Ngo et al. |
| 2013/0038226 | A1 | 2/2013 | Labanc |
| 2013/0146973 | A1 | 6/2013 | Mitra et al. |
| 2013/0214680 | A1 | 8/2013 | Kirchmeier |
| 2013/0222062 | A1 | 8/2013 | Park et al. |
| 2013/0241656 | A1 | 8/2013 | Kirchmeier |
| 2013/0231069 | A1 | 9/2013 | Drogi |
| 2013/0307055 | A1 | 11/2013 | De Boet et al. |
| 2014/0003000 | A1 | 1/2014 | McPartlin |
| 2014/0125315 | A1 | 5/2014 | Kirchmeier |
| 2014/0327415 | A1 | 11/2014 | Hoch et al. |
| 2015/0287576 | A1 | 10/2015 | Grede |
| 2015/0288274 | A1 | 10/2015 | Grede |
| 2016/0277045 | A1 | 9/2016 | Langer |
| 2016/0299548 | A1 | 10/2016 | Grede |
| 2016/0300695 | A1 | 10/2016 | Alt |

FOREIGN PATENT DOCUMENTS

| | | |
|---|---|---|
| DE | 10052004 C1 | 2/2002 |
| DE | 102004024805 A1 | 12/2005 |
| DE | 112008000120 T5 | 10/2009 |
| DE | 102009039980 A1 | 3/2010 |
| DE | 102012200702 B3 | 6/2013 |
| DE | 102012223662 A1 | 6/2014 |
| EP | 1783904 A1 | 5/2007 |
| WO | WO2009012735 A1 | 1/2009 |
| WO | WO2009012803 A1 | 1/2009 |
| WO | WO2009012826 A1 | 1/2009 |
| WO | WO2009012867 A1 | 1/2009 |
| WO | WO2009012974 A1 | 1/2009 |
| WO | WO2012023624 A1 | 2/2012 |
| WO | WO2013076174 A1 | 5/2013 |
| WO | WO 2013146973 | 10/2013 |
| WO | 2015091468 | 6/2015 |
| WO | WO2014091468 A1 | 6/2015 |
| WO | WO 2015091454 | 6/2015 |
| WO | WO 2016089992 | 6/2016 |

OTHER PUBLICATIONS

50V RF LDMOS: An ideal RF power technology for ISM, broadcast and commercial aerospace applications, freescale.com/RF power, Sep. 2011, 13 pages.
COMET, "RF Generator: The Ultimate Solution for Demanding RF Plasma Processes". http://wwww.comet-pct.com/Products/RF-Generators, Aug. 24, 2012, 1 page.
Draxler et al., "High Efficiency Envelope Tracking LDMOS Power Amplifier for W-CDMA", IEEE, manuscript, 6 pages.
Freescale Semiconductor, "RF Power LDMOS Transistors: High Ruggedness N-Channel Enhancement-Mode Lateral MOSFETs", 2010-2013, 23 pages.
Gardner, Taura, "Using RF Power Transistors in Industrial Applications", Freescale Semiconductor, Jul. 2009, 29 pages.
Gruner, Daniel, "HF-Liestungsverstaerker in modernen Silizium- und Verbindungshalbleiter-Technologien", Dissertation, Cuvillier Verlag, Goettingen, 2012, 267 pages, English abstract on p. 7.
Lehmann, Thomas, "Sequential amplifier architectures for efficient power amplifiers", Dissertation, 2010, 133 pages.
Pritiskutch et al., "Understanding LDMOS Device Fundamentals", STMicroelectronics, Jul. 2000, 4 pages.
STEVAL-TDR004V1, RF power amplifier demonstration board using two SD2933 N-channel enhancement-mode lateral MOSFETs, STMicroelectronics, Mar. 2010, 12 pages.
Theeuwen et al., "LDMOS Transistors in Power Microwave Applications", NXP Semiconductors, The Netherlands, 5 pages.
International Search Report for corresponding PCT Application No. PCT/EP2014/077944, dated Feb. 26, 2015, 10 pages.
Chinese Office Action in Application No. 201480069013.2, dated Jan. 9, 2018, 20 pages (with English translation).

* cited by examiner

POWER SUPPLY SYSTEMS AND METHODS FOR GENERATING POWER

CROSS-REFERENCE TO RELATED APPLICATIONS

This application is a continuation of and claims priority under 35 U.S.C. § 120 to PCT Application No. PCT/EP2014/077919 filed on Dec. 16, 2014, which claims priority to German Application No. DE 10 2013 226 511.5, filed on Dec. 18, 2013. The contents of both of these priority applications are hereby incorporated by reference in their entireties.

TECHNICAL FIELD

The invention relates to power supply systems and methods for generating high-frequency power that can be supplied to a plasma process or a gas laser process.

BACKGROUND

Power supply systems, in particular systems which generate power at frequencies of >1 MHz and in particular less than 200 MHz and primarily in particular less than 90 MHz, are used for example for laser excitation, in plasma coating installations or for induction applications.

Power supply systems of this type include amplifiers which generate the power that is supplied to the plasma coating installations, induction applications, or laser excitation. In principle, there are two concepts for implementing power regulation of an amplifier. In amplitude regulation, the output power of the amplifier is regulated by means of the amplitude of the input signal. In linear operation, the efficiency of the amplifier is dependent on the amplitude. Alternatively, the output power of the amplifier can be regulated by regulating the supply voltage of the amplifier. In this type of regulation, the efficiency is kept relatively constant over a large dynamic range. However, the regulation speed and thus the regulation of the output power is relatively slow, in particular slower than in the regulation concept described first.

In a power supply system, abrupt changes in the required power may occur, for example, if an arc occurs in the plasma chamber and the supplied power accordingly has to be reduced abruptly. Neither the first nor the second aforementioned regulation concept is capable of meeting the requirements of rapid regulation combined with high efficiency over a large power range.

SUMMARY

One aspect of the invention features a power supply system having a power converter which generates a high-frequency power signal and can be connected to a load to supply a plasma process or a gas laser process. The power converter includes at least one amplifier path, and an analog signal generated from a digital signal by a digital-analog converter (DAC) is supplied to the at least one amplifier path. Power of the power converter can be adjusted rapidly and reliably.

A logic circuit unit for generating the digital signal supplied to the DAC is connected upstream of the DAC. The logic circuit unit has a signal data memory, in which signal data values for generating an analog signal form are stored, an amplitude data memory, in which amplitude data values for influencing the amplitudes of the analog signals are stored, and a multiplier for multiplying the signal data values by the amplitude data values.

An adjustable voltage supply is provided, which is connected to the at least one amplifier and supplies it with a voltage. The voltage supply may in particular be a DC voltage supply, which can supply the amplifier with DC power or DC voltage.

In the power supply system, the two regulation concepts are thus combined. In plasma applications, induction applications or laser excitation applications, preset profiles are typically followed. The required dynamic range (the output power) and the moment at which the desired value jumps are thus often known in advance. It is thus possible to use the two regulation concepts concurrently. Rapid changes in power can thus be implemented by way of the amplitude regulation. Subsequently, the voltage regulation can be readjusted and the efficiency can thus be increased. In particular in the event of rapid increase, care should be taken to select the voltage and amplitude in advance in such a way that a sufficient regulation range is reserved. For short, unplanned dynamic load processes, it is conceivable merely to use the rapid amplitude regulation, since the efficiency of the system can be neglected for short periods of time. For amplitude regulation, a digital signal having information regarding the signal form and amplitude of the analog signal to be generated in the DAC can be generated in a simple manner. In particular, a sequence of digital values can be generated by a sequence of signal data values stored in a signal data memory being read out by means of a counter, and this sequence of signal data values being supplied to a multiplier and multiplied by means of this multiplier by an amplitude data value read out from an amplitude data memory. This is advantageous in particular if a plurality of analog signals are generated in parallel and subsequently combined by a combiner such that the signals to be combined can be adjusted to one another in a particularly simple and rapid manner. Amplifier paths which are actuated using an analog signal thus generated are particularly suitable for parallel operation of a plurality of amplifier paths. The powers thus generated can be combined in a simple manner at the output of the amplifier paths. This results in a total power of the power converter that can be tuned very rapidly and precisely. The load may be a plasma process or a gas laser process.

A regulation unit for regulating the voltage applied to the amplifier for the voltage supply can be provided. This regulation unit need not be implemented in the voltage supply. For example, the regulation unit may be implemented in a digital logic circuit which is connected to the voltage supply.

A control unit for setting the setpoint for both the voltage to be generated in the voltage supply and the analog signal to be generated by the DAC can be provided. In this case, the setpoints are preferably adjusted on the basis of the expected power requirement of the power supply system. In particular, it is generally known what type of high-frequency power signal will likely need to be generated. On this basis, the corresponding setpoints can then be specified for the voltage supply and the analog signal.

Alternatively or additionally, the control unit for setting a setpoint for the high-frequency power signal can be provided and a downstream digital logic circuit can be provided, which is designed to determine the setpoints for both the voltage to be generated in the voltage supply and the analog signal to be generated by the DAC. Preferably, an amplitude of the high-frequency power signal is specified as the setpoint for the high-frequency power signal. Therefore, the setpoint for the voltage to be generated and the setpoint for the analog signal to be generated can be derived from the setpoint for the amplitude of the high-frequency power signal.

Furthermore, an interface for specifying the setpoint for the voltage supply can be provided. The interface can in particular be connected to a superordinate system controller.

Furthermore, an interface can be provided for specifying an overshoot of the setpoint for the voltage to be generated in the voltage supply with respect to the amplitude of the high-frequency power signal. The amplitude of the high-frequency power signal can be the setpoint for the high-frequency power signal. However, a measured amplitude of the high-frequency power signal can also be used.

Alternatively, a calculation unit can be provided which is designed to determine the setpoints for both the voltage to be generated in the voltage supply and the analog signal to be generated by the DAC from the specification of a setpoint for the high-frequency power signal and the specification of an overshoot. In particular, a digital logic circuit can know the desired amplitude of the high-frequency power signal and the measured amplitude of the high-frequency power signal. The overshoot of the setpoint of the voltage supply can be specified or the overshoot can be calculated. In particular, the overshoot can be selected or calculated such that the voltage which is generated by the voltage supply and by which said supply powers the at least one amplifier is greater than the output amplitude of the high-frequency power signal.

Furthermore, a calculation unit can be provided which is designed to determine the setpoints for both the voltage to be generated in the voltage supply and the analog signal to be generated by the DAC from the specification of a setpoint for the high-frequency power signal and the specification of a preset speed value or a preset efficiency value. Accordingly, if rapid regulation is desired, in which case the efficiency is only of little importance, the setpoint for the voltage to be generated in the voltage supply having a greater overshoot can be set. If, on the other hand, efficient regulation is desired, the setpoint for the voltage having a small overshoot is set. The preset speed value can set how quickly the power is to be regulated. By means of this value, it can thus be determined whether the voltage should be regulated or the amplitude. The preset speed value can, for example, be selected or specified on the basis of a profile to be followed by the plasma process, the laser excitation process or the induction application. The same applies to the preset efficiency value.

Particular advantages are produced if at least two amplifier paths are provided, an analog signal generated from a digital signal by each DAC being supplied to each amplifier path and a logic circuit unit being connected upstream of each DAC. This measure results in a particularly compact design for high output powers. As a result, production is made simpler and costs are reduced. A construction of this type is also more reliable. A power converter of this type can be particularly effectively calibrated and tuned.

A digital logic circuit connected to the logic circuit unit(s) can be provided. The data values to be multiplied can be selected by the logic circuit unit.

The digital logic circuit and one or more logic circuit units can be integrated in a logic component. This increases the level of integration. Only a small number of component parts have to be used, and this saves space and is economical.

The signal data values and/or the amplitude data values can be stored in look-up tables (LUT), where they can be selected in a particularly simple manner for a signal shape and amplitude to be set.

The signal data memory and the amplitude data memory can be in the form of look-up tables (LUT). This allows memory space to be saved since only a short code can be carried in the actual databases (having a high number of entries) and the associated long title from the table can be used. For some configurations, pre-calculated results or other information can be defined in the look-up table. There is thus no need to calculate values, and so the analog signals and thus the power can be adapted extremely rapidly.

The digital-analog converter can have a reference signal input. This reference signal input can be used to influence the generation of the analog signal. In this manner, the analog signal can be changed particularly rapidly.

A driving circuit can be connected upstream of the reference signal input. By means of a driving circuit of this type, the input signal of the reference signal input can be changed rapidly in order to also rapidly change the generated analog signal as a result.

A particularly compact design is produced if the digital-analog converter and the associated logic circuit units are integrated in a direct digital synthesis (DDS) module.

If a filter arrangement for filtering the analog signal is provided between the digital-analog converter and the amplifier path, a signal having particularly few harmonics can be input at the input of the amplifier path. This makes the overall system more efficient.

The power generator can comprise more than two amplifier paths, with each of which a digital-analog converter is associated which supplies an analog signal to the respective amplifier paths. This measure results in a particularly compact design for high output powers. A power generator of this type can be tuned particularly effectively.

The amplifier paths can be connected to a combiner for combining the powers generated in the amplifier paths to form a total power. In this case, it is possible to use relatively simple combiners that are more convenient to produce yet set high requirements in terms of phase position, amplitudes and frequencies of the input signals. As a result, the power converter can be constructed in a particularly compact and cost-effective manner.

The combiner can be designed to combine the powers generated in the amplifier paths without output impedances for input signals of different intensities and/or phase position. A combiner of this type is particularly energy-efficient and economical. Furthermore, a combiner of this type can be constructed to be very compact and with few component parts.

Phase-shifting coupler units can also be used as combiners. A phase-shifted coupler unit is understood to be a unit which has a coupler and optionally a phase-shifting network for each of one or more amplifier paths, where, during proper operation, the input signals of the coupler unit have a phase position with respect to one another which is not 0° and not 180° and in particular is greater than 0° and less than 180°. For example, the input signals may be phase-shifted through 90°. A coupler unit in which the input signals thereof have a phase shift of 0° or 180° with respect to one another is not considered to be a phase-shifting coupler unit within the meaning of the present invention, since in this case the input signals are merely added up without a further phase shift.

The phase-shifting coupler unit may be a 90° hybrid coupler. This meets the requirements in an optimal manner with minimum component outlay.

A phase-shifting coupler unit is also understood to be a unit which is configured to feed reflected power, which is conducted from the load through the coupler to the amplifiers, back to the amplifiers with a different phase. In the event of mismatching, a 90° hybrid coupler, to the input terminals of which two amplifiers of the same impedance are connected, for example divides the reflected power between the two amplifiers in a manner phase-shifted by 90°.

A phase-shifting coupler unit is also understood to be a unit which has a first input impedance at the first input terminal thereof and a second input impedance at the second input terminal thereof and which is configured in such a way that the input impedances are equal when no reflected power is being passed through the coupler unit to the input terminals and are different when reflected power is being passed through the coupler unit to the input terminals. As described above, the coupler unit can be configured in such a way that it relays the power, reflected towards its output terminal, to its input terminals in a phase-shifted manner, and thus relays it to the amplifiers in the amplifier paths. The input impedances at the coupler unit can thus change and can in particular be different. This may result in the output impedance of the first amplifier taking on a different value from the output impedance of the second amplifier. This in turn may influence the properties of the coupler unit in such a way that it conducts the power of one amplifier to the other amplifier, so the amplifiers influence one another. The impedance of the amplifiers can become negative. In some load states, this may lead to the first amplifier in the first amplifier path supplying the second amplifier in the second amplifier path with power. In the past, these properties lead to the use of phase-shifting coupler units being discouraged. It was feared that the amplifiers would be brought into unstable states.

Experiments using a high reflection factor have shown that the opposite is the case, in particular if an LDMOS transistor is used in the amplifiers. The transistors heat up differently in the two amplifier paths, but in no load state is the maximum heating of the transistors as high as in power supply systems having coupler units of which the input signals have a phase difference of 0°. This may be related to the fact that, because of the lower values of the parasitic elements of the transistor, the impedance of the amplifier changes in precisely such a way that the transistors having the phase-shifting coupler unit heat up much less at the hottest point than without a phase-shifting coupler unit.

A more common reason for instability is the very rapid change in the impedance of the load, for example of the plasma process. The load change takes place so rapidly that neither an impedance adjustment network connected between the power supply system and the load, nor power regulation of the power supply system can react to the load change sufficiently rapidly. The rapid load change produces reflected power which is reflected into the amplifier. As described above, this changes the impedance of the amplifiers. Thus, after the rapid load change, the amplifiers no longer supply the same power as before the load change. However, in a power supply system comprising a phase-shifting coupler unit, in particular comprising a 90° hybrid coupler, the change in the power per change in the load state is much less than in a power supply system without a coupler unit of this type or having non-phase-shifting properties. Therefore, a power supply system comprising a phase-shifting coupler unit behaves more stably.

The advantage of using a phase-shifting coupler unit is that the two amplifier paths connected to the coupler unit experience different impedances in the event of mismatching. Moreover, in the event of mismatching, power is not fed back to the amplifier paths but can instead be dissipated into an absorption resistor. Because the amplifier paths experience different impedances, the transistors of the amplifiers warm up to different extents in the event of mismatching, unlike in the case of same-phase combination, the hotter of the two transistors being heated by about 45% less, by comparison with the use of conventional combiners, even without regulation of the supply voltage.

One amplifier, in particular each amplifier, can have an output impedance at its output that is different from the input impedance of the coupler unit. In this case, the amplifier reflects the majority of the power conducted thereto back to the coupler unit, which then conducts the power into an absorption resistor. The advantage of a power supply system of this type is that the proportion of standing waves between the load and the amplifier is reduced. The frequently mentioned drawback of a power supply system of this type is that a lot of power is converted to heat in the absorption resistor and the resistor accordingly has to be made large and provided with good cooling. This would make a power supply system of this type expensive. However, the higher expense is compensated for by much higher stability and reliability.

One amplifier, in particular each amplifier, can be configured in such a way that the output impedance thereof changes when the impedance at which it supplies its power changes. This may for example be the case if reflected power is conducted to the amplifier. In particular, the input impedance of the coupler unit connected to the amplifiers may change if the load impedance connected to the output of the coupler unit changes.

Using the power supply system according to the invention, it is possible to operate the transistors both in saturation, in other words in the fully conductive state, and in compression, in other words with an amplification which falls with increasing input power, as well as at any point in the linear range of the characteristic thereof. It is thus possible for the power supply system to supply a defined power to any desired load and thus even in the event of incorrect adjustment without heating beyond predetermined limits.

As an additional advantage, a power supply system comprising a phase-shifting coupler unit and the aforementioned transistor technology can be operated in the back-off range at higher supply voltages. It can thus be regulated more rapidly at small output powers, since the output power can be regulated by way of the input power. In addition, a phase-shifting coupler unit comprising an absorption resistor can be used for rapid pulsing between two output powers or for modulating the output power if the phases of the two amplifier paths are changed with respect to one another. In this case, part of the power flows not to the output of the power supply system, but instead to the absorption resistor.

For plasma processes, a high-frequency power signal modulated or pulsed at a modulation or pulsing frequency lower than the frequency of the high-frequency power signal is sometimes desired. This can be implemented particularly well using the power supply system. In particular, a phase-shifting coupler unit is advantageous for this purpose. To modulate or pulse the high-frequency power signal, the phase of the high-frequency signals between the amplifier paths can be adjusted by way of the modulation frequency or the pulse signal. In this way, particularly rapid pulsing or modulation is possible.

The amplifier paths can comprise transistors using LDMOS technology. LDMOS stands for "laterally diffused metal oxide semiconductor". These are MOSFETs that have thus far been used primarily in the GHz range. During use in amplifiers to generate a power which can be supplied to a plasma process, it has surprisingly been found that these transistors using LDMOS technology behave much more reliably than comparable conventional MOSFETs. This can be attributed to a much higher current carrying capacity. In particular in tests using a plurality of amplifier paths and at frequencies of 3.4 MHz, 13 MHz, 27 MHz, 40 MHz, 80 MHz and 162 MHz, these transistor types have demonstrated particularly high reliability. A further advantage of these transistor types over conventional MOSFETs is that the same transistors can be used for the stated frequencies (3.4 MHz, 13 MHz, 27 MHz, 40 MHz, 80 MHz and 162 MHz). Thus, it is now possible to use a very similar or even identical topology to construct amplifiers and power supply systems which can be used at frequencies over several decades in the range of 1 MHz to 200 MHz. These are frequencies often used in plasma processes and for gas laser excitation. The frequency can be adjusted by simply changing the driving of the DACs; the amplitude can be adjusted by changing the values in the digital memory or in the LUTs.

Conventional MOSFETs operated at these frequencies in plasma processes often have problems if too much of the power supplied to the plasma process is reflected back. Therefore, the generated power often has to be limited so as not to allow the reflected power to exceed a critical limit. Thus, the plasma processes cannot always be ignited reliably or operated in the desired power range. Moreover, complex variable impedance adjustment circuits and combiners have been provided to overcome these drawbacks. It is now particularly advantageous to use LDMOS transistors when dealing with a high level of reflected power, as for example when supplying power to plasma processes. In connection with the aforementioned combiner, the advantage of the LDMOS transistors is that much higher reflected powers can be received by the transistors. As a result, the requirements on additional impedance adjustment networks connected between the power supply system and the load are lower, and the costs of components and regulation can be reduced in these impedance adjustment networks.

A separate digital-analog converter having an associated logic switching element can be associated with each amplifier path, a superordinate memory, in particular a look-up table, being provided which is connected to the logic switching elements associated with the digital-analog converters. The memories associated with the digital-analog converters can be described by means of the superordinate memory. The result is an overall system that is suitable for very high powers and can be produced with a compact design. The system can also be adjusted and tuned very effectively in terms of the output power.

The superordinate memory can be integrated in the logic circuit. Furthermore, the driving circuit for the reference signal input of at least one digital-analog converter can be integrated in the logic component, which can be in the form of a programmable logic device (PLD), in particular a field programmable gate array (FPGA). The logic circuit can be actuated by a digital signal processor.

In particular, the DACs can also be integrated in said PLD or FPGA. Furthermore, the driving circuit for the reference signal input of at least one DAC can be integrated in the PLD or FPGA. The PLD or FGPA can be driven by a digital processor, in particular by a digital signal processor (DSP). These measures can assist in producing a compact design for high powers, and can help make the power converter well tuneable.

A measurement device can be provided which is connected to a system controller, which in turn drives the logic circuit at least indirectly, in particular by means of a digital processor or DSP. This can produce very precise and rapid regulation of the power supplied to a plasma process.

The total power generated and/or a power reflected from a load, in particular a plasma chamber, can be detected and supplied to a superordinate controller. In this way, the output power of the power converter can be controlled or regulated. This can even be carried out directly in the FPGA on a printed circuit board comprising an FPGA, a DDS and possibly a DSP.

By means of the invention, it is possible to calibrate out the tolerances of the individual amplifier paths that occur during production owing to component parts and/or limited precision. This makes it possible to combine the powers in a simple manner. This also reduces production costs since not all the stages have to be coordinated individually. The advantage in terms of speed results from the possibility of storing said calibration data in a memory, and of applying said data to all the amplifier paths concurrently, i.e., simultaneously, by means of an FPGA when setting a new power value.

Furthermore, a plurality of independent power converters or power generation systems can thus be synchronized in terms of phase and/or amplitude.

To ensure that this concept works, there has to be an amplifier topology that can be controlled by changing the amplitude of a signal supplied to an amplifier path. To be precise, the power converter can, for this purpose, be operated in various modes of operation, in particular in various operation classes. For small powers, e.g., powers of less than 200 W, the converter can thus be kept in the linear mode of operation, in particular in operation class AB. For high powers, in particular for powers of over 800 W, however, said converter is kept in an operating mode determined by switching processes, in particular operated in an operation class E or F, more preferably in an operation class "inverse class F". The modes of operation described apply to amplitude regulation. It is possible to pass into voltage regulation from all the modes of operation. It is also possible to apply the voltage regulation and the amplitude regulation concurrently, i.e., simultaneously.

Another aspect of the invention features a method for generating a high-frequency power that can be supplied to a load, in which an analog signal generated from a digital signal by a digital-analog converter (DAC) is supplied to at least one amplifier path and is amplified in the amplifier path into a high-frequency power signal, the digital signal being generated by a signal data value stored in an signal data memory being multiplied by an amplitude data value stored in an amplitude data memory, at least one amplifier of the amplifier path being supplied with power by means of an adjustable voltage. An analog signal can be an analog voltage.

This results in the advantages described above in relation to the power supply system.

The setpoints for the voltage to be generated in the voltage supply and for the analog signal to be generated by the DAC can be set by a control unit.

Alternatively, a setpoint for the high-frequency power signal can be passed to a downstream digital logic circuit by a control unit, and setpoints for both the voltage to be generated in the voltage supply and the analog signal to be generated by the DAC can be determined by the logic circuit.

Furthermore, if the setpoint for the high-frequency power signal changes, a setpoint for the analog signal to be generated by the DAC can be set in a first method step and a setpoint for the voltage to be generated in the voltage supply can be set in a second method step. As a result, rapid regulation is possible, in particular when reducing the output power, by means of the amplitude regulation. The voltage supply can then be readjusted slowly to increase the efficiency. Unnecessary losses are prevented as a result.

If the setpoint for the high-frequency power signal changes, a setpoint for the voltage to be generated in the voltage supply can be set in a first method step and a setpoint for the analog signal to be generated by the DAC can be set in a second method step. As a result, rapid regulation can take place, in particular when increasing the output power. In this case, however, it is necessary to have some knowledge beforehand that a power increase is planned. The voltage of the voltage supply for supplying the amplifier(s) can then be increased first. The efficiency drops as a result. However, since the amplitude is readjusted, the efficiency improves again after a short period of time.

The adjustable voltage can be adjusted by regulating a voltage for supplying the at least one amplifier with power.

The voltage supply can supply the at least one amplifier with a regulated voltage that has a specified overshoot above a detected or specified voltage amplitude value of the high-frequency power signal. As a result, it is possible to increase the power rapidly.

The predefinable overshoot can be specified in a number of stages. Accordingly, if rapid regulation with a low efficiency is desired, a large overshoot can be selected. If, conversely, slower regulation with better efficiency is required, a smaller overshoot may be sufficient and a smaller overshoot can accordingly be specified. In this case, relatively rapid decrease is possible, but regulation up to a higher output power can only take place relatively slowly since the adjustable voltage has to be increased in order to increase the power, and this is inherently slower.

Preferably, a sequence of digital values is supplied to a digital signal input of the digital-analog converter, from which values the digital-analog converter generates the analog signal. In this way, an analog signal can be generated particularly rapidly and precisely.

To influence the analog signal, a reference signal can be supplied to a reference signal input of the digital-analog converter. As a result, the analog signal can be influenced not only by the sequence of digital values, but also by a reference signal supplied to the reference signal input. There are thus many possibilities for influencing and precisely adjusting the analog signal.

The analog signal can be filtered, producing the aforementioned advantages as a result.

One analog signal can be generated by each of a plurality of digital-analog converters and amplified in an associated amplifier path. Therefore, relatively small powers can be generated in parallel amplifier paths and can then be combined into a total power. Owing to the relatively small generated powers, cost-effective components can be used for the individual amplifier paths.

The output signals of the amplifier paths can be coupled by a combiner to form a total power. It is thus simple to produce a high output power of the power generator. The output signals of the amplifier paths can in particular be supplied to a phase-shifting coupler unit, from which the output signals are coupled in a phase-dependent manner to form a total power.

The signal data memories and amplitude data memories can be described by a superordinate memory. By means of the superordinate memory, the content of the memory associated with the digital-analog converters can thus be determined and influenced.

The amplitude of the HF power signals, i.e., the output signal of each amplifier path, can be influenced by a predefinable amplitude of the analog signal supplied to the respective amplifier paths.

The analog signal can be supplied to the amplifier path directly, and a change in the amplitude of the analog signal can lead directly to a change in the amplitude of the HF power signal of the amplifier path. As a result, the outlay in terms of hardware is reduced in particular. Furthermore, this prevents losses of any amplitude information of the analog signal, which would have to be regenerated at a later point.

Another aspect of the invention also features a method for compensating for the tolerances in terms of amplitude and phase of the HF power signals generated in the various amplifier paths, a signal that is generated by each DAC and adjusted in each case in terms of amplitude and phase by a superordinate digital memory-control unit assembly being supplied to each amplifier path. This results in particularly effective tuning and calibration.

The amplitude of each HF power signal of each amplifier path can be influenced by the amplitude of the analog signal generated by the DAC.

According to the invention, a first signal can be supplied to the first amplifier path in the case of a first output power to be generated, a second signal can be supplied to the first amplifier path in the case of a second output power to be generated, a third signal can be supplied to the second amplifier path in the case of the first output power to be generated, a fourth signal can be supplied to the second amplifier path in the case of the second output power to be generated, the amplitudes of the first, second, third and fourth signal are stored in a memory.

Further features and advantages of the invention will become apparent from the following description of an embodiment of the invention, by way of the drawings, which show details essential to the invention, and from the claims. The individual features may each be implemented in isolation or together in any desired combination in a variant of the invention.

A preferred embodiment of the invention is shown schematically in the drawings and is described in greater detail in the following with reference to the drawings, in which.

DETAILED DESCRIPTION

Figure 1:
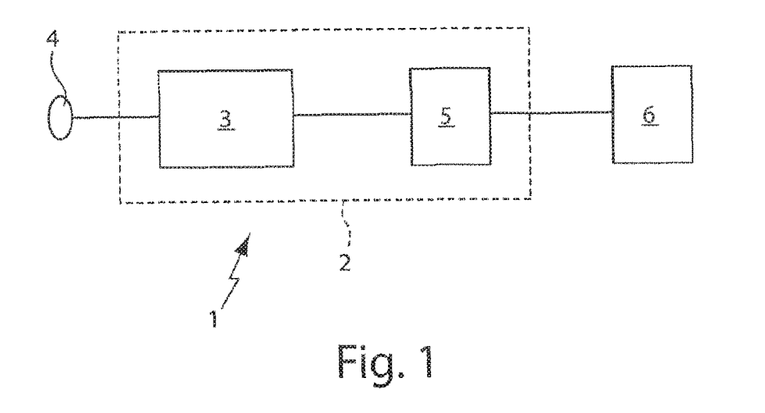
FIG. 1 is a highly schematic drawing of a plasma system including a power supply system.

FIG. 1 shows a plasma system 1 which comprises a power supply system 2. The power supply system 2 in turn comprises a power converter 3, which can be connected to a voltage supply network 4. The power generated at the output of the power converter 3 is passed via an impedance adjustment network 5 to a plasma chamber 6, in which a plasma is generated which can be used for plasma machining in the plasma chamber 6. In particular, a workpiece can be etched or a material layer can be applied to a substrate.

Figure 2:
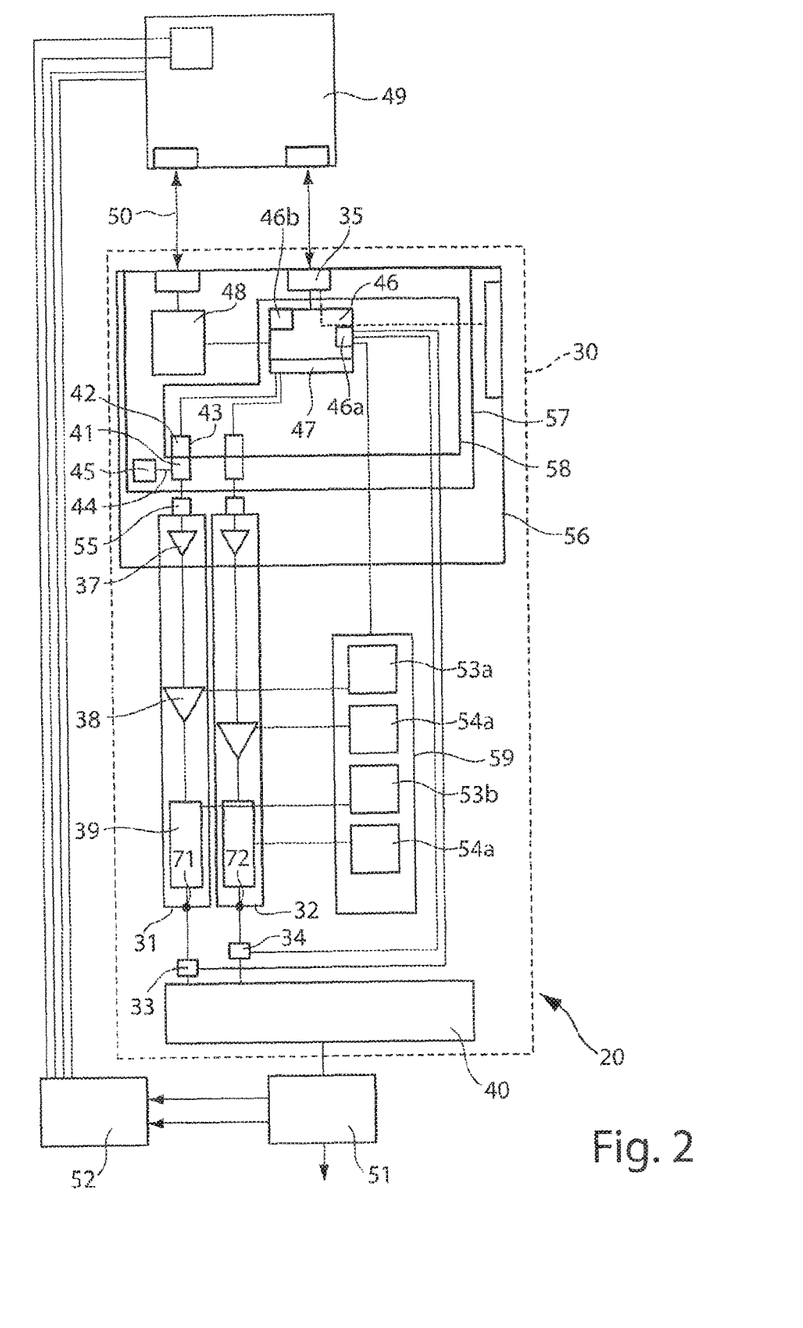
FIG. 2 is a block diagram of a power supply system.

FIG. 2 is a highly schematic drawing of a power supply system 20. The power supply system 20 has a power converter 30 which generates an output power which can be supplied to a load, for example a plasma process or a laser excitation. A plurality of amplifier paths 31, 32 are provided in the power converter 30. The amplifier paths 31, 32 are largely identical. Therefore, only one amplifier path 31 will be described in the following. The amplifier paths 31, 32 (there may be more amplifier paths 31, 32 than the two shown) comprise a plurality of amplifiers 37, 38 which are suitable for amplifying an analog signal. At the end of each amplifier path 31, 32 there is an amplifier 39 having at least one LDMOS transistor, the output of which is connected to a combiner 40 either directly or indirectly, e.g. via an impedance adjustment member and/or filter. In particular, all the outputs of all the amplifier paths 31, 32 are connected to the combiner 40, in particular in the same manner. By means of the combiner 40, the individual powers of the amplifier paths 31, 32 are coupled to form a total power.

The fact that the amplifier paths 31, 32 are largely identical does not necessarily mean that they have the same amplification. Variances in component parts and tolerances during construction of the circuits can lead to considerable differences in the phase and/or amplitude of the high-frequency power signals generated in the amplifier paths 31, 32 for the same input signal.

A digital-analog converter (DAC) 41, with which a logic circuit unit 42 is associated, is connected upstream of each of the amplifier paths 31, 32. In particular, sequences of digital values are supplied from the logic circuit unit 42 to the DAC 41, from which sequences the DAC 41 generates an analog output signal, which is supplied to an amplifier path 31, 32, optionally after being filtered by an optional filter 55. The DAC 41 and the logic circuit unit 42 can be integrated into a direct digital synthesis module (DDS module) 43, also known as a direct digital synthesizer. A separate DDS module 43, and accordingly a DAC 41 and a logic circuit unit 42, is associated with each of the amplifier paths 31, 32. The DDS module 43 is described by way of example in FIG. 3.

Figure 3:
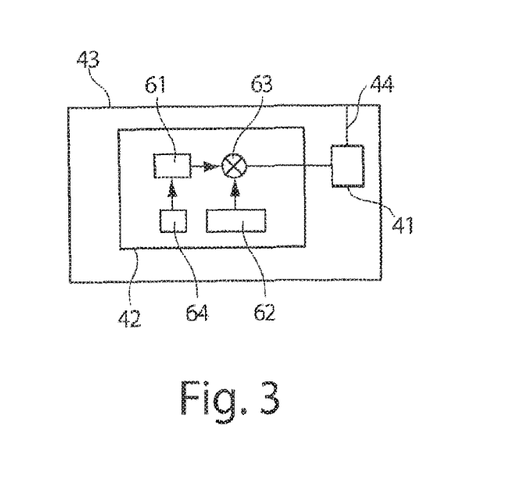
FIG. 3 is a block diagram of a DDS module.

In this case, the logic circuit unit 42 comprises:
1. a signal data memory 61, in which signal data values for generating the analog signal form are stored,
2. an amplitude data memory 62, in which amplitude data values for influencing the amplitudes of the analog signals are stored,
3. a multiplier 63 for multiplying the signal data values by the amplitude data values, and
4. a counter 64, which ensures that signal data values are read out from the signal data memory 61 and supplied to the multiplier in a predetermined clock cycle.

Both the signal data memory 61 and the amplitude data memory 62 can be in the form of lookup tables (LUTs).

The DAC 41 also comprises a reference signal input 44, upstream of which a driving circuit 45 can be connected in order to generate a reference signal. The actuation circuit 45 can be implemented in the digital logic circuit (programmable logic device, PLD) 46 to be described below. The digital logic circuit can be in the form of a field programmable (logic) gate array (FPGA).

By means of the reference signal input at the reference signal input 44, it is possible to influence the output signal, i.e. the generated analog signal from the DAC 41. The digital logic circuit 46, which likewise comprises a memory 47 in the form of a look-up table (LUT), is connected upstream of the DDS module 43. Amplitude data values can be stored in the memory 47, which values can be written into the amplitude data memory 62 by the memory 47. In addition, data for phase correction can also be stored. The values stored in the memory 47 are used to compensate for differences in the amplifier paths 31, 32 or in downstream combiners 40. They can be passed to the logic circuit unit 42, in particular to the amplitude data memory 62. The digital logic circuit 46 is actuated by a control unit 48, which in particular can be in the form of a digital signal processor (DSP) and is connected to a system controller 49 via a data bus 50.

The control unit 48, the memory 47 and the logic circuit units 42 can be implemented in one logic component 58. The logic component 58 can be in the form of a digital logic circuit PLD, in particular an FPGA. If the DACs 41 are also integrated, a compact logic module 57 is produced. The control unit 48, the memory 47, the DDS modules 43, the DACs 41, the filters 55 and the first amplifier 37 can all be implemented on a printed circuit board 56. The identical printed circuit board 56 can be used for a plurality of different power supply systems having different powers, different frequencies and different supply loads (laser, plasma, etc.).

The output power of the combiner 40 is provided to a load, e.g. a plasma process, by means of a directional coupler 51. By means of the directional coupler 51, it is possible to detect the power that is output and a power reflected by the load. The measuring signal is prepared by measurement means 52 connected to the directional coupler 51.

The measurement means 52 are in turn connected to the system controller 49. By means of the system controller 49 and on the basis of the detected output power and the reflected power detected, it is thus possible to determine which output power should be generated by the combiner 40. According to this specification, the system controller 49 can actuate the control unit 48, which can in turn actuate the digital logic circuit 46.

Arc detection means can be implemented in the measurement means. In order to be able to react rapidly to an arc, the arc detection means, i.e., the measurement means, can be directly connected to the digital-analog converter 41, in particular to the reference signal input 44 thereof, or to the driving circuit 45.

Digital values containing amplitude information, phase information and optionally frequency information are stored in the memory 47, and so an analog signal having a predetermined amplitude, frequency position and phase position can be generated at the output of the DAC 41. This allows the output signals of the individual amplifier paths 31, 32 to be adapted to one another such that said signals can be coupled in the combiner 40 in order to improve the output power. In particular, very simple combiners 40 can be used, without losing output impedances to be generated, and power loss can be kept low.

By means of the procedure according to the invention for generating an analog signal, the power in the output of the combiner 40 can be influenced and varied very rapidly.

The power supply system 20 further comprises an adjustable voltage supply 59, which in turn comprises a plurality of voltage supply modules 53a, 54a, 53b and 54b. The voltage supply modules 53a, 54a, 53b, 54b and thus the voltage supply 59 are connected to the amplifiers 38, 39 of the amplifier paths 31, 32. It is also conceivable to have a connection to the amplifier 37. In the embodiment, the amplifier 37 can be operated at a constant voltage. In particular, the amplifiers 38, 39 of the amplifier paths 31, 32 are supplied with an adjustable voltage by means of the voltage supply 59. Preferably, the voltage is a DC voltage with which the amplifiers 37-39 are supplied. Measurement means 33, 34, by means of which the output signals of the amplifier paths 31, 32 are detected, are provided at the output of the amplifier paths 31, 32. The measured values determined thereby are fed back to the logic circuit 46, in which there is a regulation unit 46a. The regulation unit 46a is in turn connected to the voltage supply 59. The voltage with which the amplifiers 37-39 are supplied can thus be regulated or adjusted.

The control unit 48 can be provided for setting a setpoint for the high-frequency power signal. Said setpoint may be the high-frequency power signal at the output of the amplifier paths 31, 32 or the high-frequency power signal at the output of the combiner 40. This setpoint can be passed to the logic circuit 46, where setpoints for both the analog signal to be determined in the DAC 41 and the voltage to be generated by the voltage supply 59 are determined. Alternatively, the setpoints for the analog signal and the voltage to be generated can be specified by the control unit 48. According to another alternative, a setpoint for the voltage to be generated in the voltage supply 59 can be specified via an interface 35 of the logic circuit 46.

In the logic circuit 46, there may also be provided a calculation unit 46b, which is designed to determine the setpoints for both the voltage to be generated in the voltage supply 59 and the analog signal to be generated by the DAC 41 from the specification of a setpoint for the high-frequency power signal and the specification of an overshoot. Alternatively, the calculation unit 46b can be designed to determine the setpoints for both the voltage to be generated in the voltage supply 59 and the analog signal to be generated by the DAC 41 from the specification of a setpoint for the high-frequency power signal and the specification of a preset speed value or a preset efficiency value. The calculation unit 46b can likewise receive the setpoints and the overshoot by means of the interface 35. The interface 35 can be connected to the system controller 49 for data exchange. In particular, it is possible to specify by means of the system controller 49 whether rapid amplitude regulation should be carried out or whether a slightly slower voltage regulation should be carried out. This will be explained on the basis of the subsequent figures, FIGS. 4 and 5.

Figure 4:
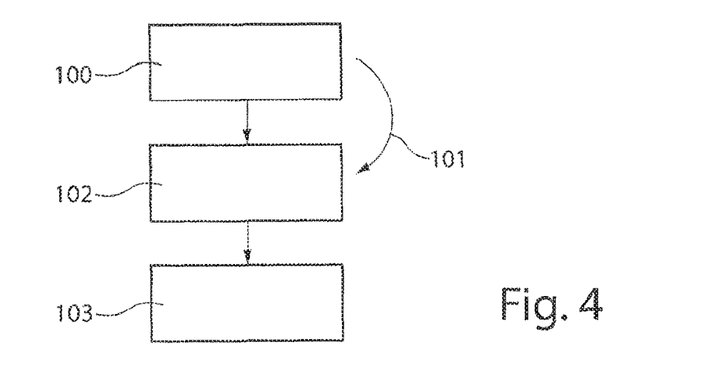
FIG. 4 a block diagram for illustrating a procedure for reducing an output power.

FIG. 4 shows the procedure when the output power has to be reduced rapidly. In a first operating condition 100, the power supply system 20 is operated at a supply voltage of for example 50 V. The amplitude of the input signal at the input of the amplifier path 31, 32 is 100%. The required output power is, for example, 1250 W and the power supply system functions at an efficiency of 80%. The arrow 101 indicates that the setpoint of the required output power jumps. In particular, the output power has to be reduced abruptly, for example to a value of 550 W. The power is rapidly adapted in this manner by means of amplitude regulation by rapidly modifying the signal generated in the amplifier paths 31, 32. In the operating condition 102, the supply voltage of the amplifiers 37-39 therefore remains at 50 V. The amplitude of the input signal is reduced to 20%. The efficiency drops to 55%. Next, in operating condition 103, the voltage and amplitude of the analog signal are readjusted in order to increase the efficiency again. Thus, in operating condition 103, the supply voltage of the amplifiers 37-39 is decreased to 30 V. The amplitude of the input signal is again 100%. The required output power is still 150 W and the efficiency has been increased again to 80%.

Figure 5:
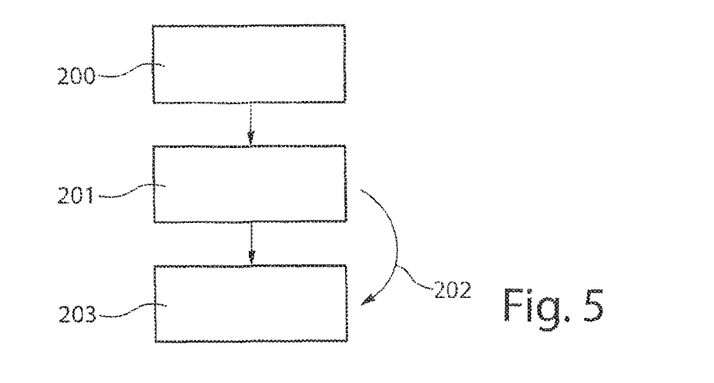
FIG. 5 is a block diagram for explaining a procedure for increasing an output power.

FIG. 5 shows the procedure when the output power has to be abruptly increased. In the operating condition 200, the power supply system 20 is operated at a supply voltage of 30 V. The amplitude of the input signal is 100%. The required output power is 550 W and the power supply system 20 is operated at an efficiency of 80%. Since it is known that a higher output power will be required, the supply voltage of the amplifiers 37-39 is first increased to 50 V during the transition from operating condition 200 to operating condition 201. The amplitude of the input signal is still only 20%. The output power remains at 550 W and the efficiency drops to 55%. Afterwards, the setpoint jumps, as indicated by the arrow 202. By means of rapid amplitude regulation, the operating condition passes from operating condition 201 to operating condition 203. The supply voltage of the amplifiers 37-39 is 55 V. The amplitude of the input signal is 100%, the output power is 1250 W and the system functions at an efficiency of 80%. To be able to execute said setpoint jump, an overshoot for the supply voltage of the amplifiers 37-39 was specified beforehand, i.e. the voltage generated in the voltage supply 59 was selected to be higher than the setpoint, which would not actually have been required in operating condition 201. As a result of this, however, the amplitude can be rapidly regulated by means of amplitude regulation, i.e. by adjusting the analog signal in the DAC 41, in order to very rapidly make the setpoint jump to a higher output power as a result.

In a power supply system according to the invention, amplitude regulation of a high-frequency signal and voltage regulation of the supply voltage of an amplifier that amplifies the high-frequency signal are combined in order to be able to deal with sudden jumps in the load.

A number of embodiments of the invention have been described. Nevertheless, it will be understood that various modifications may be made without departing from the spirit and scope of the invention. Accordingly, other embodiments are within the scope of the following claims.

What is claimed is:

1. A power supply system comprising:
   a power converter configured to generate a high-frequency power signal and comprising:
   at least one amplifier path having at least one amplifier, an analog signal generated from a digital signal by a digital-analog converter (DAC) being supplied to the at least one amplifier path,
   a logic circuit unit configured to generate the digital signal supplied to the DAC and connected upstream of the DAC, the logic circuit unit comprising:
   a signal data memory configured to store signal data values
   for generating an analog signal form,
   an amplitude data memory configured to store amplitude data values for influencing amplitudes of the analog signals, and
   a multiplier configured to multiply the signal data values by
   the amplitude data values, and
   an adjustable voltage supply connected to the at least one amplifier and configured to supply the at least one amplifier with a voltage.

2. The power supply system of claim 1, further comprising:

a regulation unit configured to regulate the voltage applied to the amplifier for the voltage supply.

3. The power supply system of claim 1, wherein the voltage supply comprises a DC voltage supply configured to supply the amplifier with DC power or DC voltage.

4. The power supply system of claim 1, further comprising:
a control unit configured to set a setpoint for the high-frequency power signal; and
a downstream digital logic circuit configured to determine setpoints for both the voltage to be generated in the voltage supply and the analog signal to be generated by the DAC.

5. The power supply system of claim 4, further comprising:
an interface configured to specify an overshoot of the setpoint for the voltage to be generated in the voltage supply with respect to an amplitude of the high-frequency power signal.

6. The power supply system of claim 4, further comprising:
a calculation unit configured to determine the setpoints for both the voltage to be generated in the voltage supply and the analog signal to be generated by the DAC from a specification of the setpoint for the high-frequency power signal and a specification of an overshoot.

7. The power supply system of claim 4, further comprising:
a calculation unit configured to determine the setpoints for both the voltage to be generated in the voltage supply and the analog signal to be generated by the DAC from a specification of the setpoint for the high-frequency power signal and a specification of a preset speed value or a preset efficiency value.

8. The power supply system of claim 1, comprising:
at least two amplifier paths, an analog signal generated from a digital signal by each DAC being supplied to each amplifier path, and
a respective logic circuit unit being connected upstream of each DAC.

9. The power supply system of claim 1, wherein the logic circuit unit comprises a digital logic circuit.

10. The power supply system of claim 9, wherein that the digital logic circuit and one or more logic circuit units are integrated in one logic component.

11. The power supply system of claim 1, further comprising:
a filter arrangement between the DAC and the amplifier path and configured to filter the analog signal.

12. The power supply system of claim 1, wherein the power converter has more than two amplifier paths, with each of which a DAC is associated and supplies an analog signal to a respective amplifier path.

13. The power supply system of claim 12, further comprising:
a combiner connected to the amplifier paths and configured to combine powers generated in the amplifier paths to form a total power.

14. The power supply system of claim 13, wherein the combiner comprises a phase-shifting coupler unit.

15. The power supply system of claim 14, wherein at least one of the amplifiers has an output impedance at its output different from an input impedance of the phase-shifting coupler unit.

16. The power supply system of claim 1, wherein the at least one amplifier path comprises an LDMOS transistor.

17. The power supply system of claim 1, further comprising:
a respective separate DAC having an associated logic switching element and being associated with each amplifier path; and
a superordinate memory connected to the logic switching element.

18. The power supply system of claim 17, wherein the superordinate memory is integrated in a logic circuit that comprises a programmable logic device (PLD) or a field programmable gate array (FPGA).

19. The power supply system of claim 18, wherein the DACs are integrated in the PLD or FPGA.

20. The power supply system of claim 17, further comprising:
a driving circuit for a reference signal input of the at least one DAC, the driving circuit being integrated with the logic circuit unit in a logic component.

21. The power supply system of claim 1, further comprising:
a measurement device connected to a system controller configured to drive the logic circuit unit at least indirectly.

22. A method of generating high-frequency power signals, comprising:
generating a digital signal by multiplying a signal data value stored in a signal data memory by an amplitude data value stored in an amplitude data memory;
generating an analog signal from the digital signal by a digital-analog converter (DAC) supplied to at least one amplifier path; and
amplifying the analog signal in the amplifier path into a high-frequency power signal, wherein at least one amplifier of the amplifier path is supplied with power by an adjustable voltage.

23. The method of claim 22, further comprising:
setting, by a control unit, setpoints for both the voltage to be generated in the voltage supply and the analog signal to be generated by the DAC.

24. The method of claim 22, further comprising: in response to a change of a setpoint for the high-frequency power signal,
setting a setpoint for the analog signal to be generated by the DAC, then
setting a setpoint for the voltage to be generated in the voltage supply.

25. The method of claim 23, further comprising: in response to a change of a setpoint for the high-frequency power signal,
setting a setpoint for the voltage to be generated in the voltage supply, then
setting a setpoint for the analog signal to be generated by the DAC.

* * * * *